(12) United States Patent
Ludwig et al.

(10) Patent No.: US 10,335,987 B2
(45) Date of Patent: Jul. 2, 2019

(54) MULTILAYER BODY AND METHOD FOR PRODUCING SAME

(71) Applicants: LEONHARD KURZ Stiftung & Co. KG, Furth (DE); PolyIC GmbH & Co. KG, Furth (DE)

(72) Inventors: Klaus Ludwig, Erlangen (DE); Christian Schulz, Furth (DE); Rainer Stahl, Nuremberg (DE)

(73) Assignees: LEONHARD KURZ STIFTUNG & CO. KG, Furth (DE); POLYIC GMBH & CO. KG, Furth (DE)

( * ) Notice: Subject to any disclaimer, the term of this patent is extended or adjusted under 35 U.S.C. 154(b) by 0 days.

(21) Appl. No.: 15/309,074

(22) PCT Filed: May 7, 2015

(86) PCT No.: PCT/EP2015/060029
§ 371 (c)(1),
(2) Date: Nov. 4, 2016

(87) PCT Pub. No.: WO2015/169890
PCT Pub. Date: Nov. 12, 2015

(65) Prior Publication Data
US 2017/0066168 A1    Mar. 9, 2017

(30) Foreign Application Priority Data

May 9, 2014 (DE) .......................... 10 2014 106 585

(51) Int. Cl.
*B29C 45/14* (2006.01)
*H01L 25/075* (2006.01)
(Continued)

(52) U.S. Cl.
CPC .. *B29C 45/14811* (2013.01); *B29C 45/14655* (2013.01); *H01L 25/0753* (2013.01);
(Continued)

(58) Field of Classification Search
USPC ........... 264/271.1, 272.11, 261, 259, 272.16, 264/272.17; 425/112, 129.1; 428/76
See application file for complete search history.

(56) References Cited

U.S. PATENT DOCUMENTS 6,488,756 B1 * 12/2002 Schoen ................... A61K 8/25
106/410
2002/0021086 A1   2/2002 Czak
(Continued)

FOREIGN PATENT DOCUMENTS

DE          10234125       2/2004
DE        102005023440    11/2006
(Continued)

OTHER PUBLICATIONS

Osram LW P473 Datasheet, 2013 (Year: 2013).*
(Continued)

*Primary Examiner* — Maria V Ewald
*Assistant Examiner* — Zachary M Davis
(74) *Attorney, Agent, or Firm* — Hoffmann & Baron, LLP

(57) ABSTRACT

The invention relates to a method for producing a multilayer body, with the steps:
a) Providing a carrier ply, on which at least one illuminant, in particular an LED, is arranged;
b) Providing a decorative ply;
c) Injection-molding a plastic ply onto the carrier ply and/or the decorative ply in an injection-molding tool.
The invention further relates to a multilayer body produced by means of such a method.

30 Claims, 7 Drawing Sheets

(51) Int. Cl.
*H01L 33/58* (2010.01)
*B29L 9/00* (2006.01)
*B29L 31/34* (2006.01)

(52) U.S. Cl.
CPC ............ *H01L 33/58* (2013.01); *B29L 2009/00* (2013.01); *B29L 2031/3493* (2013.01); *H01L 2924/0002* (2013.01); *H01L 2933/0058* (2013.01)

(56) References Cited

U.S. PATENT DOCUMENTS

| | | |
|---|---|---|
| 2007/0011862 A1 | 1/2007 | Mertens |
| 2007/0231561 A1* | 10/2007 | Pellerite ................. B32B 27/08 |
| | | 428/323 |
| 2008/0032070 A1* | 2/2008 | Hirschfelder ......... B29C 43/021 |
| | | 428/30 |
| 2008/0180957 A1 | 7/2008 | Hsu |
| 2009/0108985 A1* | 4/2009 | Haag ................. B29C 45/14639 |
| | | 338/248 |
| 2010/0196651 A1 | 8/2010 | Liao et al. |
| 2012/0113672 A1* | 5/2012 | Dubrow ................. B82Y 20/00 |
| | | 362/602 |
| 2012/0314348 A1* | 12/2012 | Moncrieff ............ H05K 5/0017 |
| | | 361/679.01 |
| 2013/0176689 A1* | 7/2013 | Nishimura ............. H05K 3/284 |
| | | 361/739 |
| 2014/0192013 A1* | 7/2014 | Lubert ................. D06F 39/005 |
| | | 345/174 |
| 2014/0227488 A1 | 8/2014 | Brehm et al. |
| 2016/0209251 A1* | 7/2016 | Keranen ................ G01D 11/28 |

FOREIGN PATENT DOCUMENTS

| | | |
|---|---|---|
| EP | 2525138 | 11/2012 |
| WO | WO2011006634 | 1/2011 |
| WO | WO2011020946 | 2/2011 |

OTHER PUBLICATIONS

Noriphan HTR datasheet, 2012 (Year: 2012).*
Carl Hanser Verlag et al., "Selbstleuchtende Seiten-begrenzung fur Lkw," pp. 52-55, Jun. 30, 2010.

* cited by examiner

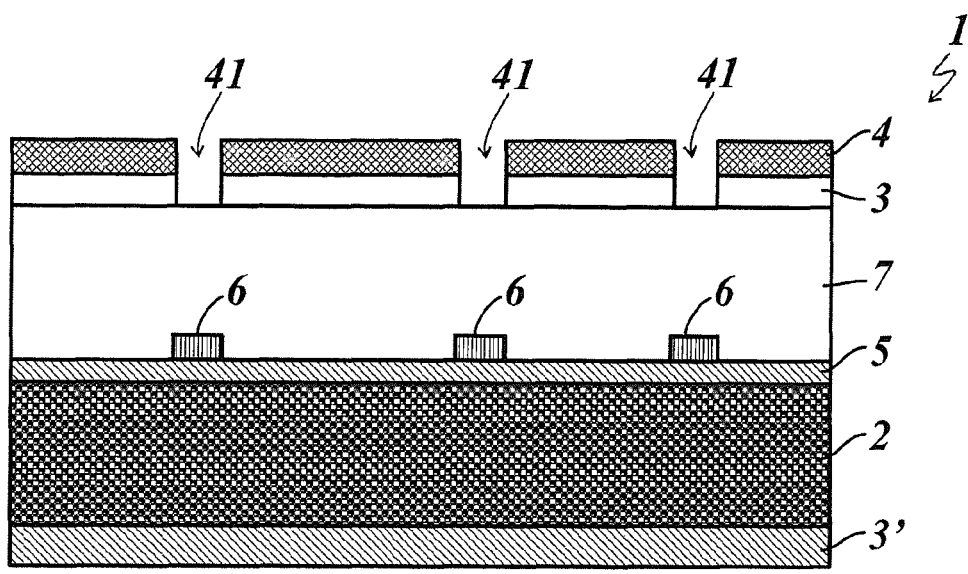
*Fig. 4*
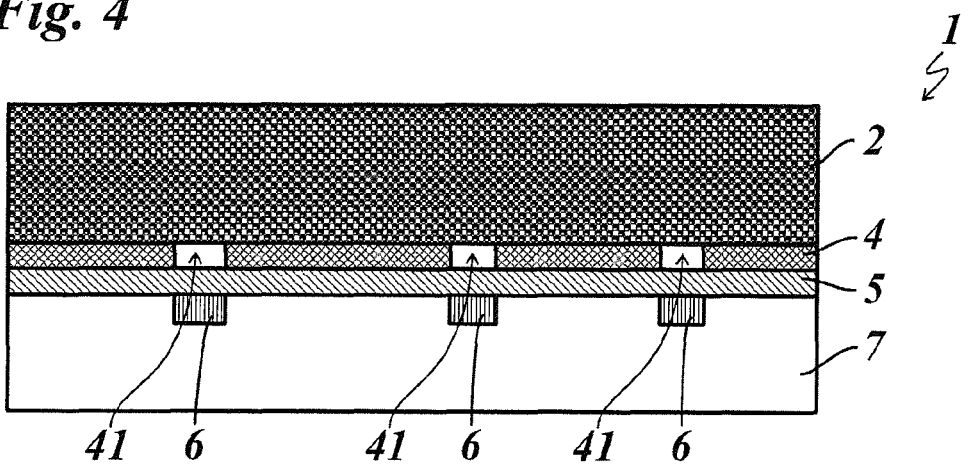
*Fig. 5*
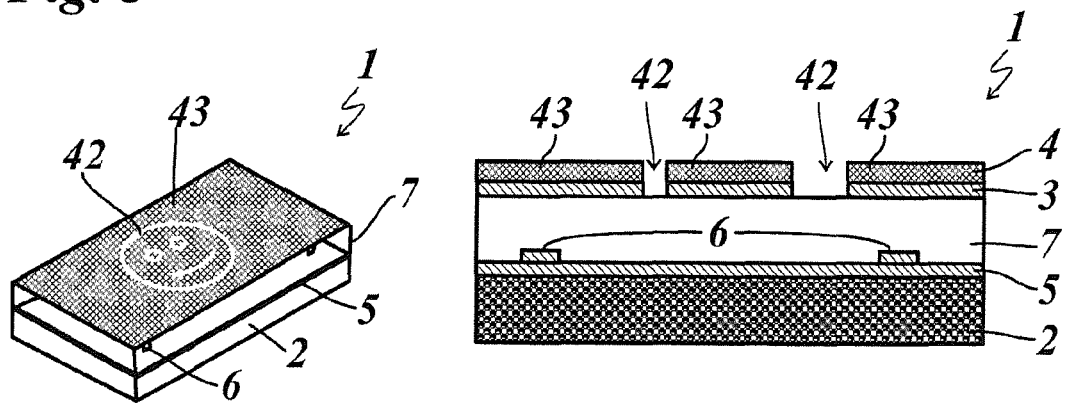
*Fig. 6*           *Fig. 7*

MULTILAYER BODY AND METHOD FOR PRODUCING SAME

This application claims priority based on an International Application filed under the Patent Cooperation Treaty, PCT/EP2015/060029, filed on May 7, 2015, and German Application No. DE 102014106585.9, filed on May 9, 2014.

BACKGROUND OF THE INVENTION

The invention relates to a method for producing a multilayer body and a multilayer body produced in this way.

In the production of plastic components, besides a decoration, the integration of electronic functions is also increasingly required. Thus plastic parts have for a long time been provided with illumination elements, in order to indicate a specific device status to the user (e.g. switch elements in a motor vehicle, control panels of household appliances).

For this, in an additional production step the already decorated plastic part usually has to be connected to a conventional circuit board which carries lighting elements, for example light-emitting diodes, and/or other electronic components. In further production steps, additional layers often have to be incorporated between the plastic panel and the lighting element, which layers for example transform a point light source such as a light-emitting diode into a surface-emitting diode (diffuser films in the form of an additional layer) or conduct the light to different positions (light conductors in the form of an additional layer). In addition, the LED circuit board has to be connected to a main circuit board or a controller of the device by means of plug connections.

Taken as a whole, the production of such decorated plastic components with integrated electronic functions is therefore laborious and expensive.

SUMMARY OF THE INVENTION

An object of the present invention is thus to provide a particularly simple and cost-effective method for producing a multilayer body with integrated decoration and electronic functions, and such a multilayer body.

Such a method for producing a multilayer body comprises the steps:

a) Providing a carrier ply, on which at least one illuminant, in particular an LED, is arranged;

b) Providing a decorative ply;

c) Injection-molding a plastic ply onto the carrier ply and/or the decorative ply in an injection-molding tool.

By means of such a method, a multilayer body is thus obtained with a carrier ply, on which at least one illuminant, in particular an LED, is arranged, a decorative ply and a plastic ply.

By a "ply" is meant a preferably substantially flat structure which can itself in turn consist of several layers. It can for example be a film or a circuit board. Alternatively however, more complex three-dimensional geometries are also possible, in particular for the plastic ply produced in the injection-molding process.

Such a ply need not necessarily represent an independent component, for example a decorative ply can also be formed by printing onto a substrate.

The bonding of decorative ply, carrier ply and plastic ply can thus take place in a single work step. A subsequent assembly of electronic components is not necessary, with the result that producing a multilayer body with integrated decoration and integrated illumination in this way is particularly simple and cost-effective. Furthermore, a particularly stable and durable multilayer body is thus created, the layers of which can be reliably arranged in a defined positional relationship.

With regard to the relative arrangement of the plies, there are several possibilities:

Firstly, it is possible that the decorative ply is applied to the carrier ply. This can take place before the injection molding of the plastic ply, with the result that decorative ply and carrier ply are back injection-molded or insert-molded together. It is however also possible to attach the decorative ply only after the injection molding, for example by lamination of a film or by printing onto the carrier and plastic ply composite. Carrier and decorative ply can also be introduced together into the injection-molding tool, with the result that they are in direct contact and are bonded during the injection molding. For this, one of the plies can for example be provided with a heat-activated adhesive, which is activated under the pressure and temperature conditions of the injection-molding process.

It is possible that the decorative ply is applied to the side of the carrier ply facing away from the at least one illuminant. The light from the at least one illuminant then passes both through the carrier ply and through the decorative ply. The carrier ply itself can thus also serve as a chromophoric layer, as a diffuser or as a similar optical element.

Alternatively, the decorative ply can also be applied to the side of the carrier ply facing the at least one illuminant, in particular between the illuminant and the carrier ply. A shorter beam path for the emitted light is hereby realized, with the result that lower absorption losses occur.

The carrier ply can hereby also be designed to be detachable, with the result that it can be removed after the back injection molding. This then leaves only the illuminants and the decorative ply, and optionally further functional elements such as conductive tracks or the like on the plastic ply.

It is expedient if the decorative ply and the carrier ply are fixed in one mold half of the injection-molding tool, in particular by mechanical clamping means and/or vacuum, and back injection-molded on one side. The back injection molding can take place on the side of the decorative ply or also of the carrier ply. It is advantageous if the ply not to be back injection-molded lies flat against one wall of the injection-molding tool, with the result that this ply does not reliably come into contact with the plastic compound.

It is further possible that the plastic ply is injection-molded between the side of the carrier ply facing away from the at least one illuminant and the decorative Ply.

Alternatively, the plastic ply can also be injection-molded between the side of the carrier ply facing the at least one illuminant and the decorative ply.

Carrier and decorative ply are for example introduced into the respective opposite halves of an injection-molding tool, without being in direct contact, and the plastic ply is injection-molded into the space between carrier and decorative ply. For this, both the carrier and the decorative ply can be provided with a heat-activated adhesive, which is activated under the pressure and temperature conditions of the injection-molding process.

In these two variants a sandwich structure thus results, in which the plastic ply is enclosed by the carrier ply and the decorative ply. The illuminants can remain accessible from the outside or be completely encapsulated in the plastic.

It is expedient if the decorative ply is fixed in a first mold half of the injection-molding tool and the carrier ply in a second mold half of the injection-molding tool, in particular by mechanical clamping means and/or by vacuum.

In turn, the respective plies preferably lie flat against an inner wall of the molding tool, with the result that they come into contact with the plastic compound on one side only.

Expediently, the decorative ply has a layer thickness of from 0.1 µm to 50 µm, preferably from 1 µm to 20 µm.

The decorative ply can be provided as an independent element, for example in the form of a film which can itself in turn have several layers, for example print or varnish layers.

Alternatively, the decorative ply can be provided by printing, in particular by casting, screen printing, intaglio printing or pad printing, and/or by varnishing on the carrier ply and/or the plastic ply.

The carrier ply is preferably provided as film, in particular made of PET (polyethylene), PEN (polyethylene naphthalate), PC (polycarbonate), PVC (polyvinyl chloride), Kapton® (poly-oxydiphenylene-pyromellitimide) or other polyimides, PLA (polylactate), PMMA (polymethyl methacrylate) or ABS (acrylonitrile butadiene styrene), with a layer thickness of from 1 µm to 500 µm, preferably from 20 µm to 300 µm.

With such carrier films, particularly thin and optionally also flexible multilayer bodies can be produced.

Alternatively, the carrier ply can be provided as a circuit board, in particular made of FR4 (glass fiber fabric in epoxy resin matrix), polyimide or paper, with a layer thickness of from 50 µm to 2 mm, preferably from 100 µm to 1.5 mm.

In particular multilayer bodies with particularly good mechanical stability can hereby be produced, which are also suitable for use under demanding conditions.

At least one plastic compound out of PMMA (polymethyl methacrylate), ABS (acrylonitrile butadiene styrene), PS (polystyrene), PE (polyethylene), PP (polypropylene), PC (polycarbonate), POM (polyoxymethylene), PA (polyamide), ASA (acrylonitrile styrene acrylate), SAN (styrene-acrylonitrile) or TPU (thermoplastic polyurethane) is preferably used for the injection molding of the plastic ply.

Through the choice of the suitable plastic material, the material properties of the multilayer body can be varied over a wide range, depending on the desired field of use thereof.

It is also possible to combine several plastics, either as a mixture or within the framework of a multicomponent injection-molding process.

The injection molding of the plastic ply is preferably carried out in a pre-tempered tool at a compound temperature of from 150° C. to 350° C., preferably from 200° C. to 300° C. and/or a pressure of from 500 bar to 2800 bar, preferably from 700 bar to 2500 bar.

It is advantageous if, for the injection molding of the plastic ply, an injection-molding tool is used, which has a cavity with at least two inner walls that are flat and parallel in areas.

If the carrier ply and the decorative ply are attached to one or both of these inner walls before the injection molding of the plastic ply, a flat multilayer body can thus be obtained.

Alternatively, for the injection molding of the plastic ply, an injection-molding tool can also be used, which has a cavity with at least one inner wall that is curved in areas.

In this way, multilayer bodies with more complex three-dimensional geometries can also be obtained. The curvature can also be present in areas only. It is further possible to further influence the geometry of the multilayer body by the use of sliders and/or cores inside the cavity. Taken as a whole, all the usual design possibilities known from injection molding are available here.

It is further expedient if SMD-LEDs (SMD=Surface Mounted Device) with a length of from 400 µm to 20 mm, preferably from 0.6 mm to 2 mm, a width of from 200 µm to 5 mm, preferably from 0.3 mm to 1.25 mm, and a height of from 200 µm to 5 mm, preferably from 0.2 mm to 1.5 mm, and/or chip LEDs with a length of from 100 µm to 2 mm, preferably from 0.2 mm to 0.5 mm, a width of from 100 µm to 2 mm, preferably from 0.2 mm to 0.5 mm, and a height of from 50 µm to 250 µm, preferably from 75 µm to 125 µm, are used as illuminants.

As alternative illuminants, in principle organic light-emitting diodes (OLEDs), light-emitting cells (LECs) or electroluminescence displays can also be used.

Furthermore, in addition to the lighting elements, additional components can also be integrated, such as e.g. logic circuits, resistors, diodes, piezoelectric loudspeakers, which are interconnected with the lighting elements. The lighting elements are used, amongst other things, for displaying information conditions; alternatively or additionally reflective, non-self-luminous display elements can also be integrated onto the carrier, such as e.g. electrophoretic or electrochromic displays.

It is further advantageous if at least one optical auxiliary layer, in particular a reflective layer or absorption layer, is applied to the decorative ply and/or the carrier ply and/or the injection-molded plastic ply.

By means of such auxiliary layers, the light guiding within the multilayer body can be controlled. It is for example possible to ensure light emission on one side only, or to avoid disturbing scattered light. Such auxiliary layers can also be applied only partially and thus for example provide a defined emission opening for the light from the at least one illuminant.

For the production of reflective layers it is advantageous if the at least one optical auxiliary layer is produced by vapor deposition or sputtering of a metal, in particular aluminum, silver, chromium, copper, gold, or alloys thereof with a layer thickness of from 1 nm to 500 nm, preferably from 5 nm to 100 nm.

Alternatively, the reflective layer can also be produced by printing of metal pigment-containing varnishes with a layer thickness of from 0.1 µm to 50 µm, preferably from 1 µm to 20 µm.

In order to apply absorption layers, it is expedient if the at least one optical auxiliary layer is produced by applying a pigmented varnish, in particular comprising carbon black pigments, with a layer thickness of from 0.1 µm to 50 µm, preferably from 1 µm to 20 µm.

It is further advantageous if the decorative ply provided comprises at least one first area which is at least partially transparent with respect to the spectrum of the light emitted by the at least one illuminant, and at least one second area which is non-transparent, i.e. opaque, with respect to the spectrum of the light emitted by the at least one illuminant.

The light emission from the multilayer body can also be controlled in this way. The first and second areas can form simple display surfaces or also complex optical information.

It is further preferred if the decorative ply is arranged so that the at least one illuminant, seen perpendicular to the surface of the decorative ply, comes to overlap with the at least one first area.

In this way a direct light emission can be realized. This can for example be used for the point illumination of display surfaces.

Alternatively, the decorative ply can be arranged so that the at least one illuminant, seen perpendicular to the surface of the decorative ply, comes to overlap with the at least one second area.

Thus no direct light emission through the first area is possible. This can for example be used for the even backlighting of flat structures.

Direct and indirect out-coupling of the light produced by the at least one illuminant can of course also be combined in order to realize attractive optical effects.

It is further advantageous if colorants, in particular dyes and/or pigments and/or particles and/or quantum dot materials and/or phosphorescent materials are added to the plastic material used for the injection molding of the plastic ply, and/or to a material forming a layer of the carrier ply, which colorants absorb and/or scatter in the wavelength range of the light emitted by the at least one illuminant and/or can be excited to fluoresce or phosphoresce in the visible wavelength range.

An homogenization of the light distribution in the plastic ply and/or carrier ply can hereby be achieved. This is suitable in particular in order to create evenly backlit surfaces.

At the same time, or alternatively, in particular with the use of fluorescent or absorbing substances or quantum dots, the spectrum of the light emitted by the at least one illuminant can hereby be influenced in a targeted manner, with the result that various color effects can be created.

It is expedient if the added colorants comprise inorganic pigments and/or particles, in particular of silicon dioxide, pyrogenic silicic acid, titanium dioxide, zinc sulfide or a metal, with a particle size of from 5 nm to 500 µm, preferably from 500 nm to 100 µm.

It is further advantageous if one surface of the carrier ply is matt.

The luminance can also hereby be homogenized over the carrier ply in order to achieve even illuminated surfaces. Additional diffusers can thus be dispensed with.

It is further advantageous if a decorative ply is provided, which has a plurality of areas that differ in color and/or transparency with respect to the spectrum of the light emitted by the at least one illuminant.

Multicolored graphic elements can hereby be presented, the appearance of which does not depend directly on the color of the illuminants used. It is particularly expedient if such a decorative ply is applied flat, and therefore has no emission openings. In addition it is possible in this way to realize decorations which are not visible in the switched-off state of the at least one illuminant.

It is further expedient if a partial layer which is non-transparent with respect to the spectrum of the light emitted by the at least one illuminant, in particular a metal layer which comprises optical information, is applied to the decorative ply.

A defined emission geometry for the light is thus created hereby. This is in particular expedient in conjunction with a decoration that is applied flat. It can thus also be ensured that the desired optical information is visible only when the at least one illuminant emits light.

It is further advantageous if an optically active relief structure, in particular a diffractive structure, a zero-order diffraction structure, a macrostructure, a lens structure, a microlens structure, a microprism structure, is incorporated into the decorative ply and/or the carrier ply and/or the plastic ply, in particular by replication, in particular during the production of the decorative ply and/or by molding in particular into the plastic ply of a matrix arranged in the injection-molding tool. The matrix can be bonded to the respective mold half in one piece or alternatively be designed as a separate insert or insertion part.

By means of such structures the light emission from the multilayer body can also be controlled in a targeted manner. Depending on the kind of relief structure and the relative arrangement thereof with respect to the at least one illuminant, the out-coupling of the light emitted by the illuminant can be supported or prevented in areas, in a targeted manner.

It is further expedient if, during the injection molding of the plastic ply, at least two plastic compounds are used, which differ in one optical property, in particular in their optical refractive index.

This can be carried out with various multicomponent injection-molding processes. For example the casting of the different plastic compounds can take place sequentially in different injection-molding tools. Alternatively however, the geometry of an injection-molding tool can be changed for the sequential casting steps, for example by means of suitable sliders. It is also possible for the plastic or carrier plies to be positioned on a rotary plate which approaches different tool inserts for the sequential casting steps.

Depending on the geometry of the partial areas of the plastic ply prepared from the different plastic compounds, in particular depending on the shape of the boundary surfaces between these partial areas, and depending on the difference in the refractive indices, various effects can hereby be achieved which can also serve for light guiding. In particular, lens effects can be achieved, in particular by means of light refraction, or mirror surfaces can be created by total reflection at the boundary surfaces.

It is further advantageous to apply a conductive track layer to the carrier ply, for contacting the at least one illuminant.

External contact means, such as for example additional printed circuit boards can hereby be dispensed with, which makes the production and assembly of the multilayer body particularly simple. By means of the conductive track layer, further electronic components optionally present on the carrier ply, such as for example sensors, antenna structures or the like, can also be contacted.

It is expedient if the conductive track layer is produced by vapor deposition, sputtering, galvanic deposition or lamination of a metal, in particular aluminum, silver, chromium, copper, gold, or alloys thereof, and/or by application of conductive pigments, nanoparticles, ITO (indium-tin-oxide), ATO (antimony-tin-oxide), conductive organic polymers, in particular PEDOT (poly-3,4-ethylenedioxythiophene) or PANI (polyaniline), carbon nanotubes, graphene or carbon black with a layer thickness of from 1 nm to 500 µm, preferably from 10 nm to 50 µm.

Preferably, the conductive track layer comprises at least one coupling surface wherein, seen perpendicular to the carrier ply, a complementary coupling surface is applied to the side of the carrier ply facing away from the at least one illuminant.

Via the complementary coupling surfaces, an alternating voltage can be capacitively coupled into the conductive track layer. Thus no continuous conductive structures need to be guided onto the surface of the multilayer body in order to supply the illuminants or other electronic components with voltage or to transmit control signals to the latter.

Alternatively or additionally, the conductive track layer can comprise at least one winding and/or antenna structure wherein, seen perpendicular to the carrier ply, a complementary winding and/or antenna structure is applied to the side of the carrier ply facing away from the at least one illuminant.

This also makes possible the contact-free coupling of an alternating voltage and/or the transmission of control signals. In this case, however, the coupling takes place inductively.

It is further possible to attach to the carrier ply at least one electrical contact element which electrically contacts the conductive track layer and which, during the injection molding of the plastic ply, is at most partially enclosed by the plastic compound.

In this case a direct contacting of the conductive track layer thus takes place towards the outside. This can optionally take place via suitable plug connectors or the like.

It is expedient if a through-connection through the carrier ply and/or a crimping element is attached as electrical contact element.

Additionally or alternatively, during the injection molding of the plastic ply, at least one partial area of the conductive track layer may not be enclosed by the plastic compound and/or after the injection molding of the plastic ply, a partial area of the carrier ply, on which at least one partial area of the conductive track layer is arranged, may be detached from the plastic ply.

A direct contacting of the conductive track layer is also possible in this way.

BRIEF DESCRIPTION OF THE DRAWINGS

The invention will now be explained in more detail with reference to embodiment examples. There are shown in FIG. 1 An embodiment example of a multilayer body with a decorative ply and a carrier ply with lighting elements and with a plastic ply back injection-molded on one side;

FIG. 4 An alternative embodiment example of a multilayer body with a decorative ply and a carrier ply with lighting elements and with a plastic ply arranged between decorative ply and carrier ply;

FIG. 5 An alternative embodiment example of a multilayer body with a decorative ply and a carrier ply with lighting elements and with a plastic ply back injection-molded on one side;

FIG. 6 A top view of an embodiment example of a multilayer body with indirectly backlit decoration;

FIG. 7 A sectional representation of the multilayer body according to FIG. 6;

DETAILED DESCRIPTION OF THE INVENTION

Figure 1:
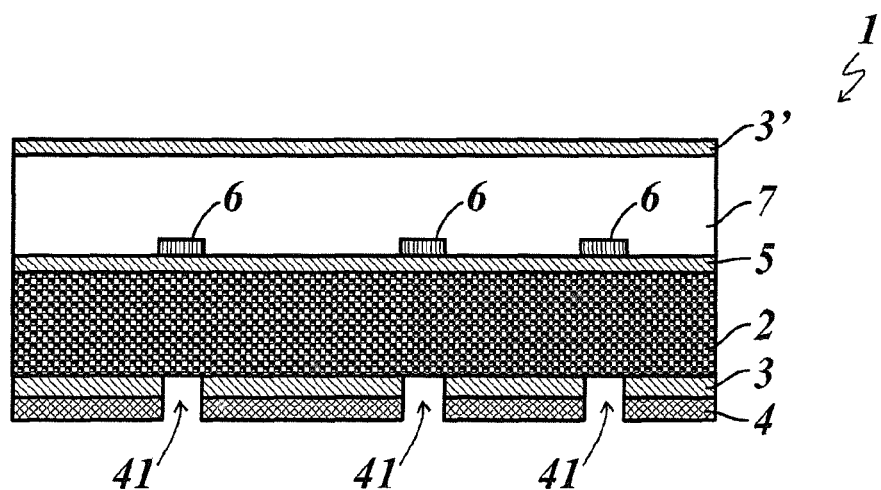

FIG. 1 shows a first embodiment example of a multilayer body 1. This comprises a carrier ply 2. On one side of the carrier ply 2, an optical auxiliary layer 3 is applied, on which a decorative ply 4 is in turn arranged. In the decorative ply 4, apertures 41 are provided, which also pass through the auxiliary layer 3. Alternatively, and not shown here, optically transparent varnishes or other materials can also be arranged in these apertures 41.

On the side of the carrier ply 2 facing away from the auxiliary layer 3 and the decorative ply 4, a conductive track layer 5 is applied, by means of which illuminants 6 are contacted.

On the side of the illuminants 6, a plastic ply 7 is injection-molded, to which a further optical auxiliary layer 3' is connected.

The carrier ply 2 can be formed as film. This preferably consists of PET, PEN, PC, PVC, Kapton®, PLA, PMMA or ABS, with a layer thickness of from 1 μm to 500 μm, preferably from 20 μm to 300 μm.

Alternatively, the carrier ply 2 can be designed as a circuit board, in particular made of FR4, polyimide or paper, with a layer thickness of from 50 μm to 2 mm, preferably from 100 μm to 1.5 mm.

The auxiliary layers 3, 3' can be formed as reflective layers or absorption layers and are in particular meant to ensure that each illuminant 6 is only visible through the allocated aperture 41, with the result that scattered light is avoided. The light output of the illuminants at the apertures is meant to be improved by means of a reflective layer, in that laterally scattered light is reflected into the apertures.

Reflective layers are preferably produced by vapor deposition, sputtering or the like of a metal, in particular aluminum, silver, chromium, copper, gold, or alloys thereof, with a layer thickness of from 1 nm to 500 nm, preferably from 5 nm to 100 nm.

For absorption layers, pigmented varnishes, in particular comprising carbon black pigments, with a layer thickness of from 0.1 μm to 50 μm, preferably from 1 μm to 20 μm, can be used.

The decorative ply 4 can be designed as film, in particular as laminating or IMD film (IMD=in-mold decoration). It preferably has a layer thickness of from 0.1 μm to 50 μm, particularly preferably from 1 μm to 20 μm.

Alternatively, the decorative ply 4 can also be a print or varnish layer. This is then preferably applied by printing, in particular by screen printing, intaglio printing or pad printing, and/or by varnishing on the carrier ply and/or the plastic ply.

The decorative ply 4 itself can in turn have a plurality of layers or areas with different optical properties, with the result that complex visual designs can also be created. Specific possibilities for the design of the decorative ply 4 are explained later with reference to further embodiment examples.

The conductive track layer 5 is preferably produced by vapor deposition, sputtering, galvanic deposition or lamination of a metal, in particular aluminum, silver, chromium, copper, gold, or alloys thereof, and/or by application of conductive pigments, nanoparticles, ITO, ATO, conductive organic polymers, in particular PEDOT or PANI, carbon nanotubes, graphene or carbon black with a layer thickness of from 1 nm to 500 µm, preferably from 10 nm to 50 µm.

Figure 3:
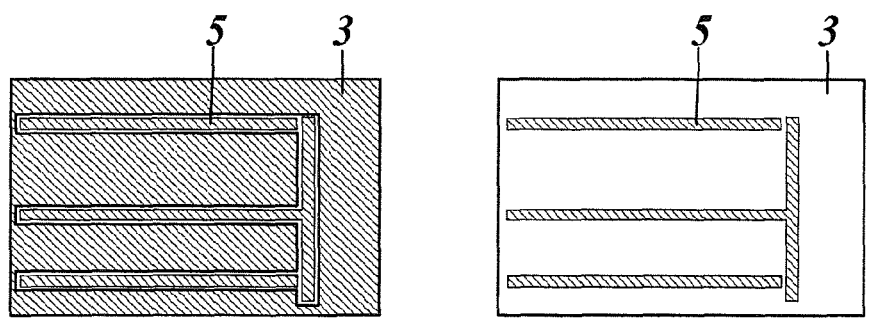
FIG. 3 A schematic view of an optical auxiliary layer with integrated conductive tracks.

As shown by FIG. 3, the conductive track layer 5 can also be integrated into an optical auxiliary layer 3 and thus at the same time provide optical properties. For example, the optical auxiliary layer can be a reflective metal layer of vapor-deposited, sputtered or printed metal layers and at the same time correspondingly provide metallic conductive tracks by means of suitable structuring.

The illuminants 6 are preferably light-emitting diodes. In particular, SMD-LEDs with a length of from 400 µm to 20 mm, preferably from 0.6 mm to 2 mm, a width of from 200 µm to 5 mm, preferably from 0.3 mm to 1.25 mm, and a height of from 200 µm to 5 mm, preferably from 0.2 mm to 1.5 mm, and/or chip LEDs with a length of from 100 µm to 2 mm, preferably from 0.2 mm to 0.5 mm, a width of from 100 µm to 2 mm, preferably from 0.2 mm to 0.5 mm, and a height of from 50 µm to 250 µm, preferably from 75 µm to 125 µm, can be used here. As alternative illuminants, in principle organic light-emitting diodes (OLEDs), light-emitting cells (LECs) or electroluminescence displays can also be used.

The plastic ply 7 is preferably produced by injection molding. For this, the composite of carrier ply 2 and the plies 3, 4, 5 arranged thereon as well as the illuminants 6 is introduced into a cavity of an injection mold and back injection-molded with a plastic compound. In order to create a better adhesion between carrier ply 2 and plastic ply 7, a thermally activated adhesive layer can optionally be applied to the side of the composite of carrier ply 2 and the plies 3, 4, 5 arranged thereon as well as the illuminants 6 facing the plastic ply 7.

PMMA, ABS, PS, PE, PP, PC, POM, PA, ASA, SAN or TPU is preferably used as plastic compound. Combinations of these plastics, either as a mixture or in a multicomponent process are also possible.

The injection molding of the plastic ply 7 is carried out in a preferably pre-tempered tool at a compound temperature of from 150° C. to 350° C., preferably from 200° C. to 300° C. and/or a pressure of from 500 bar to 2800 bar, preferably from 700 bar to 2500 bar.

The further embodiment examples of multilayer bodies 1 described below differ from this substantially by the number, arrangement and geometrical design of the plies and components. The properties of the individual plies and elements described above are also valid for the following embodiment examples.

Figure 2:
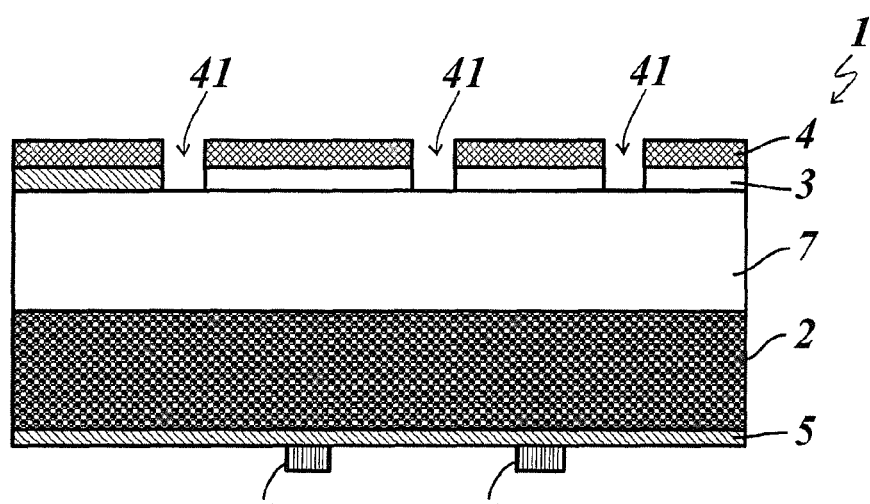
FIG. 2 An alternative embodiment example of a multilayer body with a decorative ply and a carrier ply with lighting elements and with a plastic ply arranged between decorative ply and carrier ply.

In the embodiment according to FIG. 2, the decorative ply 4 and the optical auxiliary layer are arranged on a first side of the plastic ply 7 and the carrier ply 2 with the conductive track layer 5 and the illuminants 6 on the opposite side of the plastic ply 7. The illuminants point away from the plastic ply 7 and in this case are not located overlapping with the apertures 41, with the result that these are indirectly backlit.

In this variant, the decorative ply 4 together with the optical auxiliary layer 3 is directly applied to the plastic ply 7 by an IMD process. The carrier ply 2 with the LEDs 6 is introduced on the side of the injection-molding tool opposite the decorative ply 4 with the carrier ply in the direction of the injection-molding compound. The decoration and application of the carrier ply 2 to the plastic ply 7 can take place in one operation here.

The embodiment according to FIG. 4 is constructed analogously to this. It differs from the embodiment according to FIG. 2 only in that the carrier ply 2 with the illuminants 6 and the conductive track layer 5 is directed towards the plastic ply 7 and in that the illuminants 6 are located overlapping with the apertures 41, with the result that these are directly backlit. On the side of the carrier ply 2 facing away from the illuminants 6, a further auxiliary layer 3' is arranged which prevents light emission on this side and/or reflects the backward-reflected light forwards, in order to improve the light output. However, if scattered light from adjacent illuminants is to be avoided in the apertures, this optical auxiliary layer 3' is designed to be absorbing.

In the embodiment according to FIG. 5 the plastic ply 7 is injection-molded on one side as in the embodiment according to FIG. 1. In contrast to FIG. 1, however, decorative ply 4, conductive track layer 5 and illuminants 6 are here arranged on the same side of the carrier ply 2 and directed towards the plastic ply 7. Auxiliary layers 3, 3' are dispensed with here.

FIG. 6 shows a top view of a further embodiment of a multilayer body 1. The same multilayer body 1 is shown in FIG. 7 in a schematic sectional view. The light from the LEDs 6 is indirectly coupled out here. These are preferably not positioned below an aperture 41 in the decorative ply 4. This can be particularly advantageous if the light is to be homogeneously distributed via larger or distributed smaller emission openings 41. In this case it is advantageous if the optional optical auxiliary layers 3, 3' are designed to be mirroring, for example as a mirroring vapor-deposited or sputtered metal layer, so that as much light as possible is reflected into the emission openings 41.

For design reasons, it is sometimes required that the lighting structures are not visible when the LEDs 6 are switched off, or that the decorative plies 4 change the color of the LED light in the switched-on state. This can be achieved in that the decorative ply 4 as shown in FIG. 6 is designed to be continuous over the LEDs 6. The decorative ply can have areas 42, 43 with different colors, structures and transparencies, which form the desired decoration.

In particular, if the surface is single-colored and the structures to be shown are only meant to visibly light up in the switched-on state of the LEDs 6, it is advantageous to print the decorative ply 4 continuously. The lighting structures are preferably produced over a metallic or particularly light-proof layer 3, which contains the structure to be shown as apertures (i.e. which forms a shadow mask under the decorative ply 4). The layer sequence shown in FIG. 1 can be used, with the difference that the decorative ply 4 is printed without apertures 41.

Figure 8:
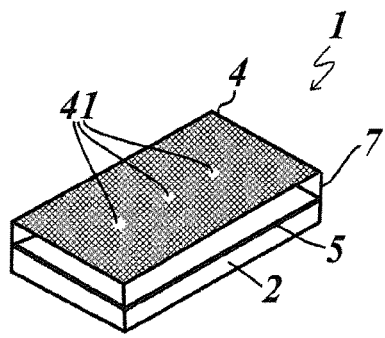
FIG. 8 A top view of an embodiment example of a multilayer body with directly backlit decoration.
Figure 9:
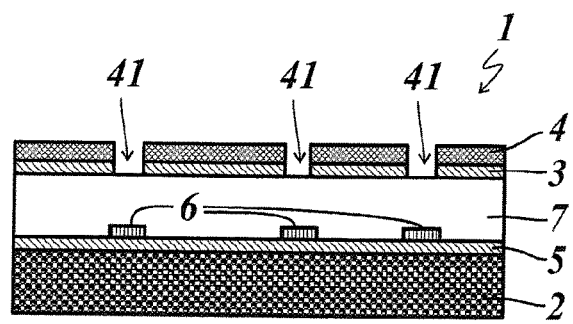
FIG. 9 A sectional representation of the multilayer body according to FIG. 8.

If the LEDs 6 are meant to be directly visible, e.g. as indicators, the decorative ply 4 can contain apertures 41 directly over the LEDs 6 in the viewing direction, as shown in FIGS. 8 and 9. The optical auxiliary layers 3, 3' lying outside the direct beam path of the LEDs 6 are to be designed to be as light-absorbing as possible, in order to prevent light being emitted into adjacent apertures 41 (optical "crosstalk").

Figure 10:
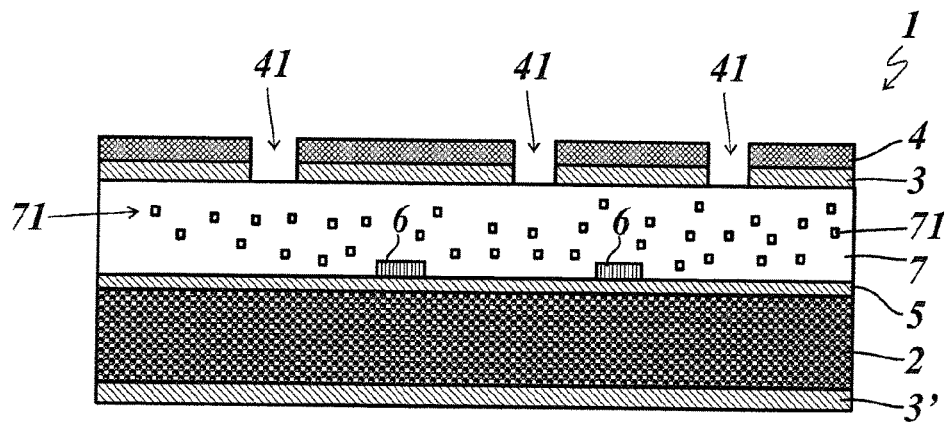
FIG. 10 An alternative embodiment example of a multilayer body with diffuser particles in the plastic ply.

If a flat homogeneous light effect is to be achieved, e.g. if the LEDs 6 are to back-light lettering, a light distribution that is as homogeneous as possible is required. Homogenization of the light can be achieved by the use of many LEDs 6 (very complex and cost-intensive) or by the use of diffuser particles 71, and/or homogeneously distributed fluorescent dyes in the injection-molding compound of the plastic ply 7 and/or the carrier ply 2. This is shown in FIG. 10.

Color effects can additionally be produced by dyeing the material and/or fluorescence. Optionally, insoluble fluorescent pigments which then at the same time serve as light-scattering particles 71 can also be added to soluble fluorescent dyes.

The light-scattering particles 71 can comprise inorganic pigments and/or particles, in particular of silicon dioxide, pyrogenic silicic acid, titanium dioxide, zinc sulfide or a metal, with a particle size of from 5 nm to 500 µm, preferably from 500 nm to 100 µm.

Fine optical gratings 72 which prevent or support the out-coupling of the light can be incorporated into the plastic ply 7 and/or the decorative ply 4. Subwavelength gratings are preferably suitable for this, but also comparatively deep and/or coarse structures such as in particular microprisms with a refractive effect. Preferred grating parameters for subwavelength gratings are a period preferably of from 200 nm to 500 nm and a grating depth preferably of from 100 nm to 500 nm. The type of grating is here preferably selected from the linear, cross or hexagonal grating series. When microprisms are used, the lateral extent dx or dy of the prisms is from 1 µm to 100 µm, preferably from 5 µm to 50 µm. The structure depth is preferably approximately from 0.3 to 2 times the lateral extent. The arrangement of the microprisms can be both regular, i.e. periodic, and also random or pseudorandom.

Figure 11:
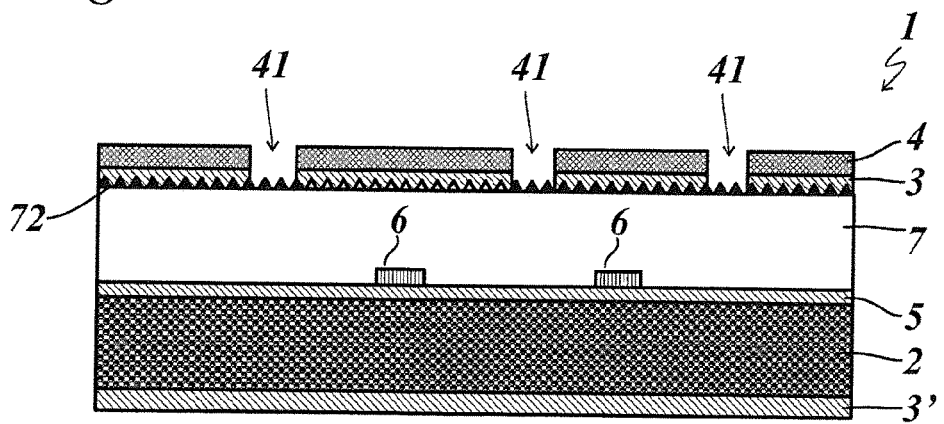
FIG. 11 An alternative embodiment example of a multilayer body with an optical grating over the whole surface FIG. 12 An alternative embodiment example of a multilayer body with an optical grating over the whole surface in the plastic ply and the carrier ply.
Figure 13:
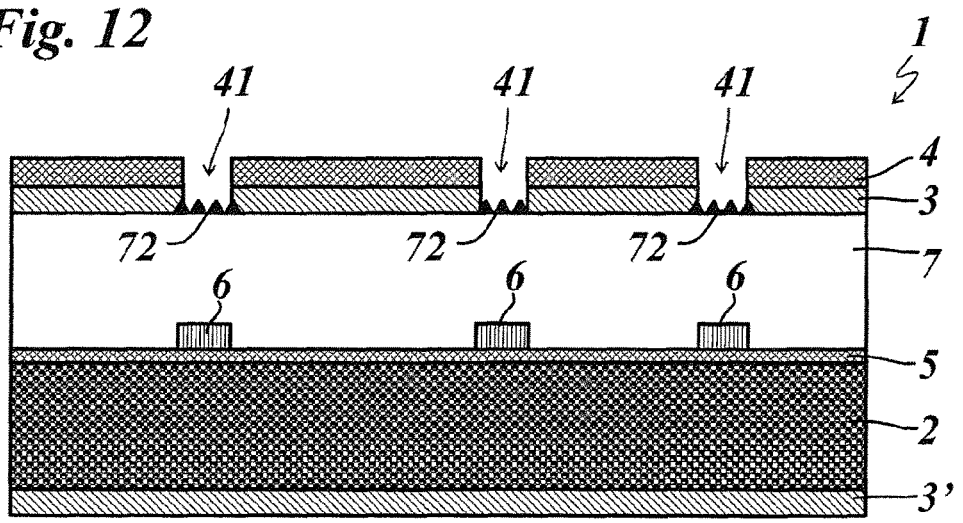
FIG. 13 An alternative embodiment example of a multilayer body with an optical grating over part of the surface in the plastic ply.

The optical gratings 72 can be arranged over the whole surface (see FIG. 11) or only in the area of the apertures 41 (see FIG. 13) in the decorative ply 4 and/or the optical auxiliary layer 3 and/or the plastic ply 7.

The production takes place e.g. by means of replication or by structuring of the injection-molding tool, with the result that the gratings 72 are formed during the injection molding of the plastic ply 7.

Figure 12:
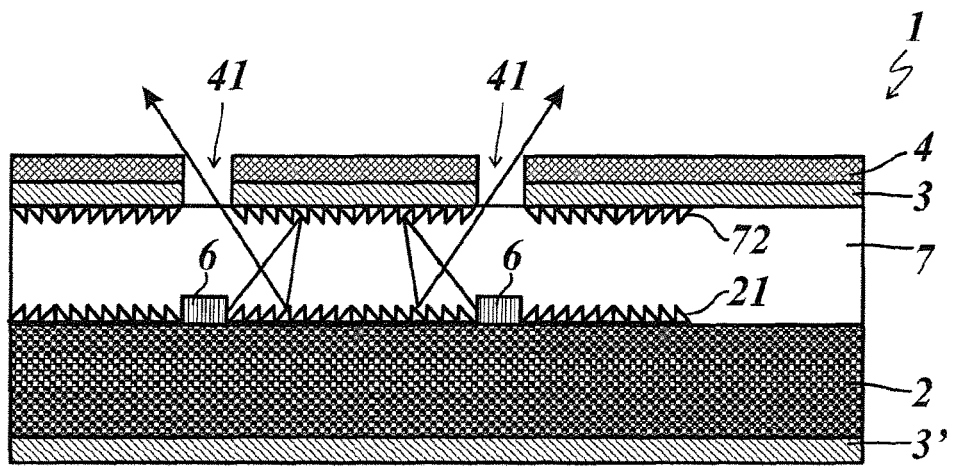

As a further variant, a further optical grating 21 can optionally be realized on the carrier ply 2, as shown in FIG. 12. The apertures 41 are not covered by the grating 72 here. The arrows indicate a possible beam path of the light emitted by the LEDs 6.

Figure 14:
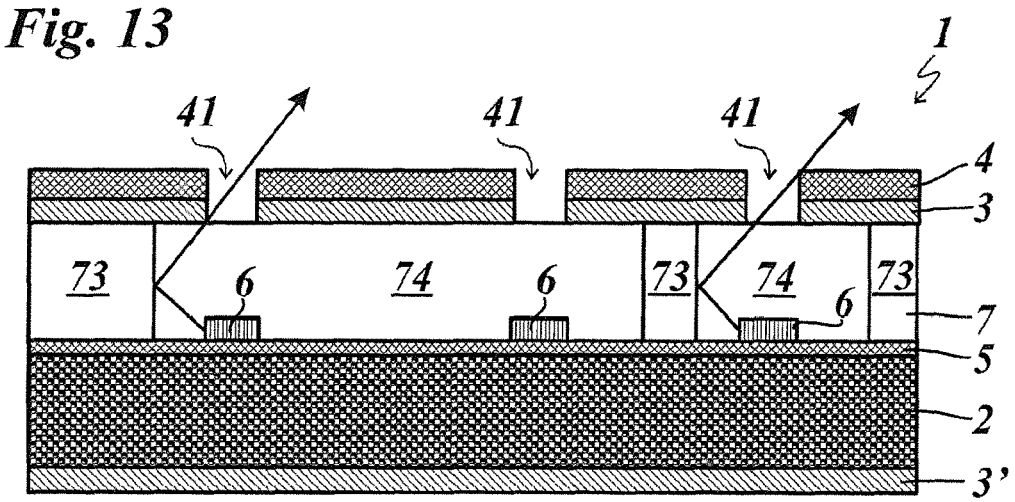
FIG. 14 An alternative embodiment example of a multilayer body with a multicomponent plastic ply with reflective structures.
Figure 15:
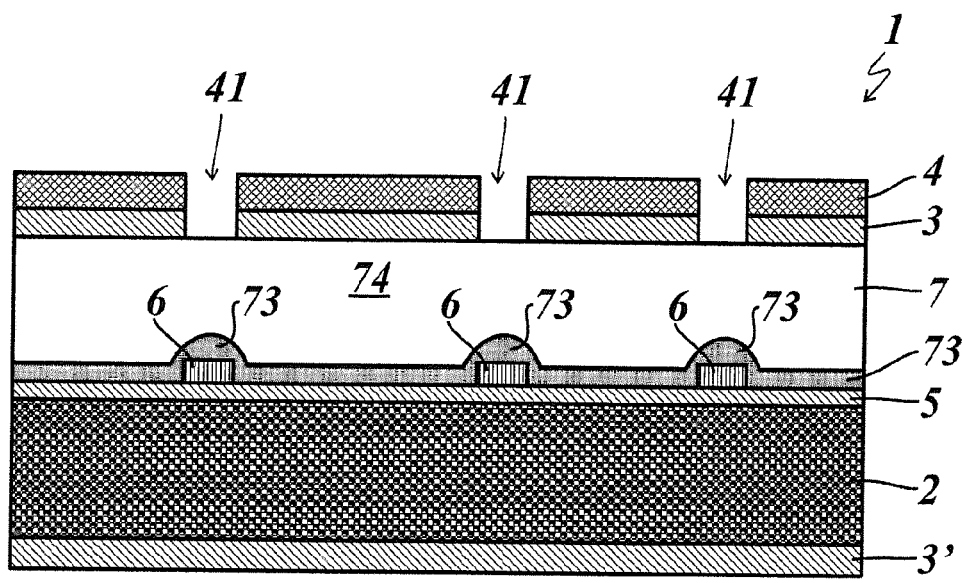
FIG. 15 An alternative embodiment example of a multilayer body with a multicomponent plastic ply with lens structures.

Furthermore, the use of two different injection molding compounds with different optical refractive indices, which each form partial areas 73, 74 of the plastic ply 7, can be used in order to produce lens effects, in particular by light refraction, as shown in FIG. 15, or to reflect the light at boundary surfaces, as shown in FIG. 14. For example, in this way crosstalk, i.e. optical crosstalk between several emission openings 41 can be prevented or the light output at the emission openings 41 can be improved.

The plastic ply 7 in these cases is formed by two-component injection molding. Either the areas 73, 74 are injected in separate tools, i.e. the area 73 is first injected onto the LEDs 6, the work piece removed and inserted into a second tool. The area 74 is then injected there.

A further possibility is the use of a rotary plate. First, e.g. the area 73 is injected. The tool is then opened and the component rotates half a rotation with the rotary plate, with the result that it lies opposite a second tool insert. The area 74 is then injected there.

Simultaneously to this, the area 73 is attached to a second work piece. After the injection of area 74 on the first work piece, the finished first work piece is removed and the rotary plate again rotates half a rotation.

The use of a tool in which the cavity can be changed by using sliders, is also conceivable.

The following embodiment examples relate to the electrical contacting of the conductive track layer 5. This can be realized by direct galvanic contact but also contactlessly.

Figure 16:
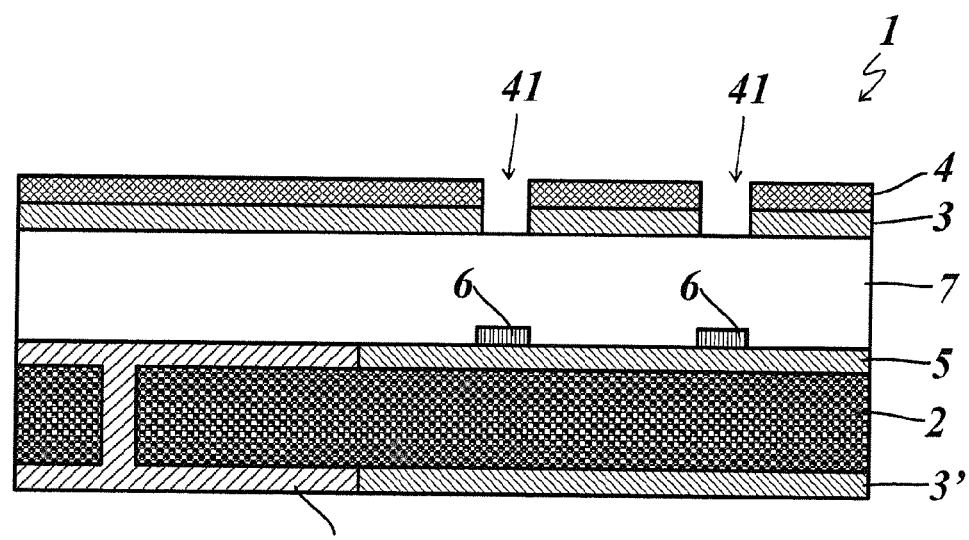
FIG. 16 An alternative embodiment example of a multilayer body with a through-connection through the carrier ply.

For the direct contacting, a through-connection 8 (VIA, vertical interconnect access) can for example be attached through the carrier ply 2, as shown in FIG. 16. A direct connection of the power supply to the conductive track layer is thereby formed. Such a through-connection 8 can be produced for example galvanically, by means of a targeted deposition of metal inside a hole previously produced within the carrier ply 2, or by punching in a metal pin. The use of a crimping technique is also conceivable. Both take place before the carrier ply 2 is processed in the injection molding.

Figure 17:
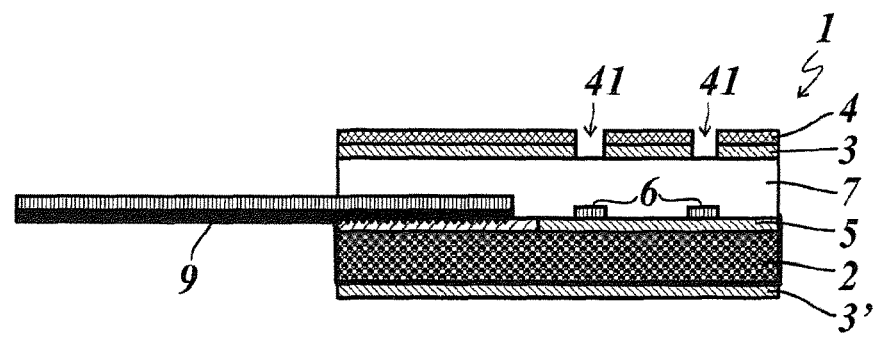
FIG. 17 An alternative embodiment example of a multilayer body with a lateral crimping connection.

A further possibility for contacting by means of crimping is presented by the use of a second conductive track substrate 9 which, as shown in FIG. 17, is placed on the sides of the conductive track layer 5 on the carrier ply 2 and anchored by means of a crimping technique.

In this way, the contacting can be achieved on the sides of the multilayer body 1. This mechanically produced bonding can either be produced in a separate step before the injection-molding process, or during the latter, using an integrated crimping tool.

For the bonding of the conductive track substrates, not only mechanical bonding techniques come into consideration, but also adhesion or soldering. Within the process, this step can be carried out separately before the back injection-molding process.

Figure 18:
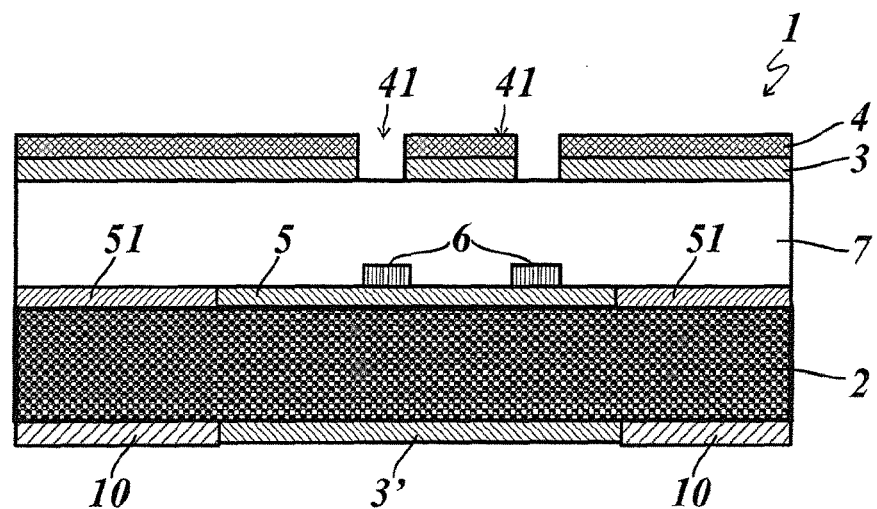
FIG. 18 An alternative embodiment example of a multilayer body with capacitive contacting.

An indirect contacting of the conductive track layer 5 can take place capacitively, as shown in FIG. 18. The basis for the capacitive coupling is two coupling surfaces 51 within the conductive track layer 5, which in each case have to be positioned at least in areas over allocated coupling surfaces 10 located outside. By applying an alternating electric field, an opposing field builds up on the capacitors formed by the coupling surfaces 10, 51 in each case lying one over the other, with the result that a current can flow through the consumers contacted by the conductive track layer 5.

Figure 19:
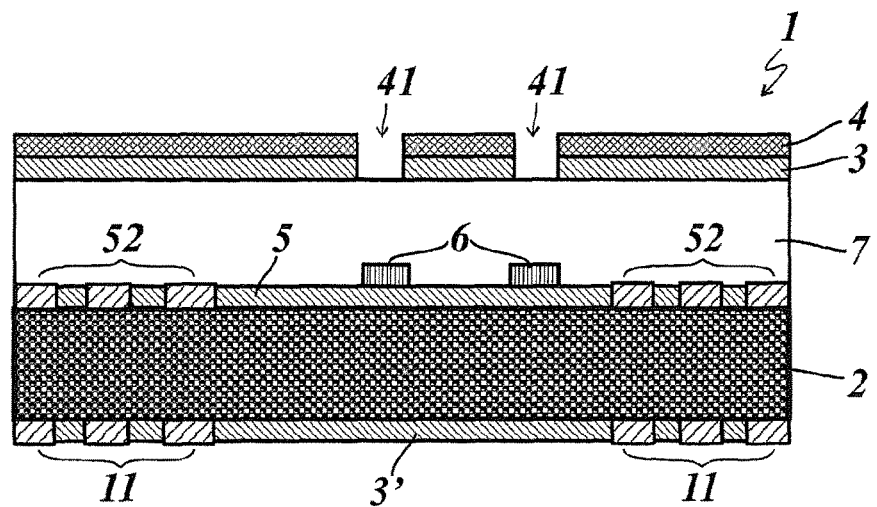
FIG. 19 An alternative embodiment example of a multilayer body with inductive contacting FIG. 20 An alternative embodiment example of a multilayer body with partially accessible conductive track layer.

Instead of coupling surfaces lying one over the other, antenna structures 52, 11 arranged analogously thereto can be used, in order to thus realize an inductive coupling. Ideally these are matched so that the external transmitting antenna 11 works in resonance with the internal receiving antenna 52. The basic structure is shown in FIG. 19.

In this example also, via the inductive coupling, an alternating current is produced in the conductive track layer 5, without the latter having to be contacted directly. A rectification can also take place by means of suitable components. Depending on the size and form of the antennae 11, 52, the resonance frequency and coverage can also be set. Via modulation of the signal, information or control commands can in addition be transmitted to the enclosed electronics integrated on the carrier layer. The external antenna 52 can also be applied directly to the carrier layer 2 or be attached after completion of the multilayer body 1.

Figure 20:
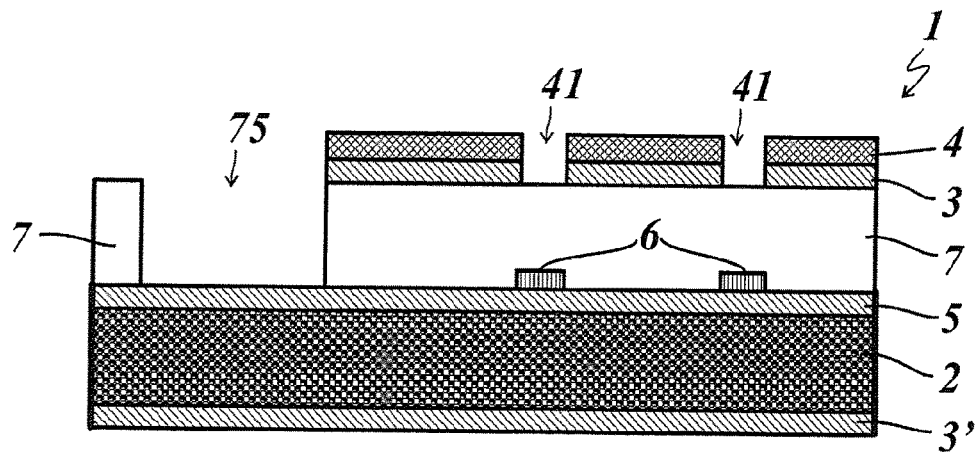
Figure 21:
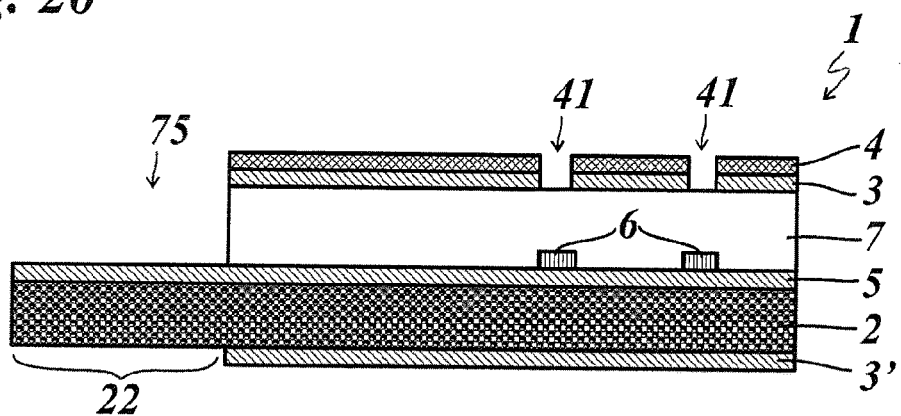
FIG. 21 An alternative embodiment example of a multilayer body with conductive track layer partially accessible at the edge.

A further possibility for the direct contacting of the conductive track layer 5 consists of not completely enclosing the latter in plastic during the injection molding of the plastic ply 7. Either an aperture 75 in the plastic ply 7 can be left open, as shown in FIG. 20, or the plastic ply 7 may not be applied up to the edge of the carrier ply 2, with the result that a projecting tab 22 of the carrier ply is produced, on which the conductive track layer 5 can be contacted (see FIG. 21).

Figure 22:
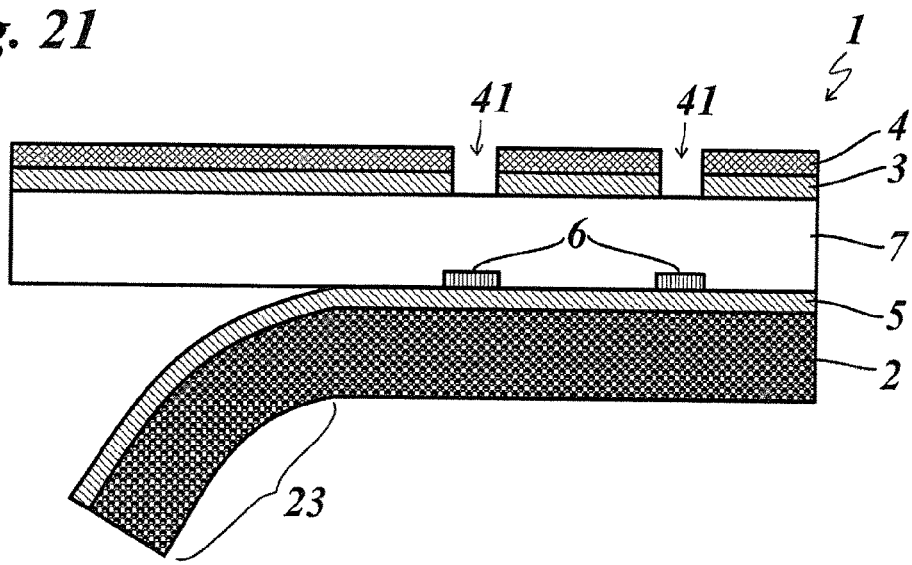
FIG. 22 An alternative embodiment example of a multilayer body with partially detachable carrier ply.

Alternatively, as shown in FIG. 22, after the injection molding of the plastic ply 7, a partial area 23 of the carrier ply 2, onto which the conductive track layer 5 extends, can also be detached from the plastic ply 7. For this, a corresponding detachment layer can optionally be applied to the partial area 23 before the injection molding. The detachment layer preferably consists of a wax, a siloxane polymer or a fluorine-containing polymer (e.g. Teflon®) and has a layer thickness of from 10 nm to 5 µm, preferably from 100 nm to 1 µm.

LIST OF REFERENCE NUMERALS

1 multilayer body
2 carrier ply
3, 3' optical auxiliary layer
4 decorative ply
5 conductive track layer
6 illuminant
7 plastic ply
8 through-connection
9 conductive track substrate
10 coupling surface
11 antenna structure
21 grating structure
22 tab
23 detachable area of the carrier ply
41 aperture
42, 43 area of the carrier ply
51 coupling surface
52 antenna structure
71 diffuser particles
72 grating structure
73, 74 area of the plastic ply
75 aperture

The invention claimed is:

1. A method for producing a multilayer body, with the steps:
providing a carrier ply, on which at least one illuminant is arranged;
applying a first optical auxiliary layer to a side of the carrier ply opposite the at least one illuminant, the first optical auxiliary layer having at least one aperture;
providing a decorative ply over the first optical auxiliary layer, the decorative ply having at least one aperture aligned with the at least one aperture of the first optical auxiliary layer;
injection-molding a plastic ply onto the carrier ply and/or the decorative ply in an injection-molding tool; and
applying a second optical auxiliary layer to a side of the plastic ply opposite the first optical auxiliary layer.

2. The method according to claim 1, wherein the decorative ply and the carrier ply are fixed in one mold half of the injection-molding tool by mechanical clamping means and/or vacuum, and back injection-molded on one side.

3. The method according to claim 1, wherein the decorative ply has a layer thickness of from 0.1 µm to 50 µm.

4. The method according to claim 1, wherein the decorative ply is provided by screen printing, intaglio printing or pad printing, and/or by varnishing on the carrier ply and/or the plastic ply.

5. The method according to claim 1, wherein the carrier ply is provided as film made of PET, PEN, PC, PVC, Kapton, PLA, PMMA or ABS, with a layer thickness of from 1 µm to 500 µm.

6. The method according to claim 1, wherein the carrier ply is provided as a circuit board made of FR4, polyimide or paper, with a layer thickness of from 50 µm to 2 mm.

7. The method according to claim 1, wherein at least one plastic compound out of PMMA, ABS, PS, PE, PP, PC, POM, PA, ASA, SAN or TPU is used for the injection molding of the plastic ply.

8. The method according to claim 1, wherein the injection molding of the plastic ply is carried out in a pre-tempered tool at a material temperature of from 150° C. to 350° C., and/or a pressure of from 500 bar to 2800 bar.

9. The method according to claim 1, wherein, for the injection molding of the plastic ply, an injection-molding tool is used, which has a cavity with at least two flat and parallel inner walls.

10. The method according to claim 1, wherein, for the injection molding of the plastic ply, an injection-molding tool is used, which has a cavity with at least one curved inner wall.

11. The method according to claim 1, wherein SMD-LEDs with a length of from 400 µm to 20 mm, a width of from 200 µm to 5 mm, and a height of from 200 µm to 5 mm, and/or chip LEDs with a length of from 100 µm to 2 mm, a width of from 100 µm to 2 mm, and a height of from 50 µm to 250 µm are used as illuminants.

12. The method according to claim 1, wherein at least one of the first and second optical auxiliary layers is produced by vapor deposition or sputtering of a metal, comprising aluminum, silver, chromium, copper, gold, or alloys thereof, with a layer thickness of from 1 nm to 500 nm, or by printing of metal pigment-containing varnishes with a layer thickness of from 0.1 µm to 50 µm.

13. The method according to claim 1, wherein at least one of the first and second optical auxiliary layers is produced by applying a pigmented varnish comprising carbon black pigments, with a layer thickness of from 0.1 µm to 50 µm.

14. The method according to claim 1, wherein the decorative ply provided comprises at least one first area which is at least partially transparent with respect to the spectrum of the light emitted by the at least one illuminant, and at least one second area which is non-transparent with respect to the spectrum of the light emitted by the at least one illuminant, the at least one first area forming the at least one aperture.

15. The method according to claim 14, wherein the decorative ply is arranged so that the at least one illuminant, seen perpendicular to the surface of the decorative ply, comes to overlap with the at least one first area.

16. The method according to claim 14, wherein the decorative ply is arranged so that the at least one illuminant, seen perpendicular to the surface of the decorative ply, comes to overlap with the at least one second area.

17. The method according to claim 1, wherein colorants comprising dyes and/or pigments and/or particles and/or quantum dot materials are added to the plastic material used for the injection molding of the plastic ply, and/or to a material forming a layer of the carrier ply, which colorants absorb and/or scatter in the wavelength range of the light emitted by the at least one illuminant and/or can be excited to fluoresce or phosphoresce in the visible wavelength range.

18. The method according to claim 17, wherein the added colorants comprise inorganic pigments and/or particles of silicon dioxide, pyrogenic silicic acid, titanium dioxide, zinc sulfide or a metal, with a particle size of from 5 nm to 500 μm.

19. The method according to claim 1, wherein one surface of the carrier ply is matt.

20. The method according to claim 1, wherein a decorative ply is provided, which has a plurality of areas that differ in color and/or transparency with respect to the spectrum of the light emitted by the at least one illuminant.

21. The method according to claim 1, wherein a partial layer which is non-transparent with respect to the spectrum of the light emitted by the at least one illuminant is applied to the decorative ply, and wherein the partial layer comprises a metal layer having optical information.

22. The method according to claim 1, wherein a diffractive structure, a zero-order diffraction structure, a macrostructure, a lens structure, or a microlens structure, a microprism structure, is incorporated into the decorative ply and/or the carrier ply and/or the plastic ply by replication and/or by molding of a matrix arranged in the injection-molding tool.

23. The method according to claim 1, wherein, during the injection molding of the plastic ply, at least two plastic compounds are used, which differ in their refractive index.

24. The method according to claim 1, wherein a conductive track layer is applied to the carrier ply, for contacting the at least one illuminant.

25. The method according to claim 24, wherein the conductive track layer is produced by vapor deposition, sputtering, galvanic deposition or lamination of a metal, comprising aluminum, silver, chromium, copper, gold, or alloys thereof, and/or by application of conductive pigments, nanoparticles, ITO, ATO, conductive organic polymers PEDOT or PANI, carbon nanotubes, graphene or carbon black with a layer thickness of from 1 nm to 500 μm.

26. The method according to claim 24 wherein the conductive track layer comprises at least one coupling surface wherein, seen perpendicular to the carrier ply, a complementary coupling surface is applied to the side of the carrier ply facing away from the at least one illuminant.

27. The method according to claim 24, wherein the conductive track layer comprises at least one winding and/or antenna structure wherein, seen perpendicular to the carrier ply, a complementary winding and/or antenna structure is applied to the side of the carrier ply facing away from the at least one illuminant.

28. The method according to claim 24, wherein at least one electrical contact element which electrically contacts the conductive track layer and which, during the injection molding of the plastic ply, is at most partially enclosed by the plastic compound is attached to the carrier ply.

29. The method according to claim 28, wherein a through-connection through the carrier ply and/or a crimping element is attached as electrical contact element.

30. The method according to claim 24, wherein, during the injection molding of the plastic ply, at least one partial area of the conductive track layer is not enclosed by the plastic compound and/or wherein, after the injection molding of the plastic ply, a partial area of the carrier ply, on which at least one partial area of the conductive track layer is arranged, is detached from the plastic ply.

* * * * *